(12) United States Patent
Meyer et al.

(10) Patent No.: US 9,891,074 B2
(45) Date of Patent: Feb. 13, 2018

(54) SENSOR SYSTEM WITH A THREE HALF-BRIDGE CONFIGURATION

(71) Applicant: NXP B.V., Eindhoven (NL)

(72) Inventors: Robert Meyer, Hamburg (DE);
Thomas Preisner, Hamburg (DE);
Michael Schoeneich, Hamburg (DE)

(73) Assignee: NXP B.V., Eindhoven (NL)

( * ) Notice: Subject to any disclaimer, the term of this patent is extended or adjusted under 35 U.S.C. 154(b) by 341 days.

(21) Appl. No.: 14/722,358

(22) Filed: May 27, 2015

(65) Prior Publication Data

US 2015/0377646 A1   Dec. 31, 2015

(30) Foreign Application Priority Data

Jun. 25, 2014  (EP) ..................................... 14173800

(51) Int. Cl.
*G01B 7/30* (2006.01)
*G01D 5/14* (2006.01)
(Continued)

(52) U.S. Cl.
CPC ........... *G01D 5/14* (2013.01); *G01R 33/0023* (2013.01); *G01R 33/0029* (2013.01); *G01R 33/09* (2013.01)

(58) Field of Classification Search
CPC  G01R 33/0023; G01R 33/0029; G01R 33/09; G01R 27/2629; G01R 17/00; G01D 5/14
(Continued)

(56) References Cited

U.S. PATENT DOCUMENTS 5,949,051 A * 9/1999 Kiriyama ............. G01D 5/2451
                                                    235/439
6,246,233 B1 * 6/2001 Griffen .................. G01D 5/145
                                                    324/207.12
(Continued)

FOREIGN PATENT DOCUMENTS

CN        101512370 A      8/2009
CN        103282745 A      9/2013
(Continued)

OTHER PUBLICATIONS

Matsuno et al., A Temperature—Compensated Bridge Circuit, Research Institute of Electronics, Shizuoka University, 1993. IEEE.*

(Continued)

*Primary Examiner* — Patrick Assouad
*Assistant Examiner* — Sean Curtis
(74) *Attorney, Agent, or Firm* — Rajeev Madnawat

(57) ABSTRACT

A sensor system for sensing a physical quantity is disclosed. The sensor system includes a first sensor path comprising a first first sensing element and a second first sensing element and a first intermediate node being provided in between the first first sensing element and the second first sensing element. The sensor also includes a second sensor path comprising a first second sensing element and a second second sensing element and a second intermediate node being provided in between the first second sensing element and the second second sensing element. A third sensor path is provided and comprises a first third sensing element and a second third sensing element and a third intermediate node being provided in between the first third sensing element and the second third sensing element. A signal processing device is also included.

15 Claims, 1 Drawing Sheet

(51) Int. Cl.
*G01R 33/00* (2006.01)
*G01R 33/09* (2006.01)

(58) Field of Classification Search
USPC .................. 324/207.11–207.26, 244, 260
See application file for complete search history.

(56) References Cited

U.S. PATENT DOCUMENTS

| | | | | |
|---|---|---|---|---|
| 6,501,678 | B1* | 12/2002 | Lenssen | B82Y 25/00 257/E27.005 |
| 7,112,962 | B2* | 9/2006 | Ricks | G01D 5/145 324/207.25 |
| 7,262,594 | B1* | 8/2007 | Tomino | G01D 3/08 324/207.21 |
| 7,312,609 | B2* | 12/2007 | Schmollngruber | B82Y 25/00 324/207.21 |
| 7,402,998 | B2* | 7/2008 | Kikuiri | G01R 33/093 324/207.21 |
| 8,278,916 | B2* | 10/2012 | Sakai | G01D 5/145 324/207.21 |
| 8,354,840 | B2* | 1/2013 | Shimauchi | G01D 5/145 324/207.21 |
| 8,766,623 | B2* | 7/2014 | Ausserlechner | G01D 5/145 324/202 |
| 9,222,988 | B2* | 12/2015 | Zhang | G01R 33/0029 |
| 9,347,799 | B2* | 5/2016 | Nazarian | G01D 5/147 |
| 9,411,024 | B2* | 8/2016 | Raberg | G01R 33/09 |
| 2002/0171418 | A1* | 11/2002 | Hinz | G01D 5/145 324/207.22 |
| 2004/0100251 | A1* | 5/2004 | Lohberg | G01D 5/145 324/166 |
| 2008/0012558 | A1* | 1/2008 | Rossler | B82Y 25/00 324/252 |
| 2008/0053245 | A1* | 3/2008 | Yao | G01D 5/145 73/862.08 |
| 2008/0054895 | A1* | 3/2008 | Sasaki | B82Y 25/00 324/252 |
| 2008/0061775 | A1* | 3/2008 | Kikuiri | B82Y 25/00 324/244 |
| 2008/0186019 | A1* | 8/2008 | Hinz | G01D 5/145 324/207.21 |
| 2009/0001965 | A1* | 1/2009 | Ausserlechner | G01D 5/145 324/202 |
| 2009/0206827 | A1* | 8/2009 | Aimuta | G01D 5/145 324/207.25 |
| 2010/0090690 | A1* | 4/2010 | Lohberg | G01D 5/24438 324/207.25 |
| 2011/0068780 | A1* | 3/2011 | Sakai | G01D 5/145 324/207.25 |
| 2012/0092000 | A1* | 4/2012 | Lohberg | G01D 5/24438 324/173 |
| 2013/0264915 | A1* | 10/2013 | Suzuki | B62D 5/0484 310/68 B |
| 2013/0278250 | A1* | 10/2013 | Raberg | G01R 33/09 324/252 |
| 2015/0137797 | A1* | 5/2015 | Ausserlechner | G01D 3/08 324/207.2 |
| 2015/0377646 | A1* | 12/2015 | Meyer | G01D 5/14 324/207.25 |
| 2016/0178397 | A1* | 6/2016 | Jost | G01D 5/16 324/207.12 |
| 2016/0320461 | A1* | 11/2016 | Raberg | G01R 33/09 |
| 2017/0139016 | A1* | 5/2017 | Reimann | G01R 33/0029 |
| 2017/0276514 | A1* | 9/2017 | Schmitt | G01R 33/091 |
| 2017/0276740 | A1* | 9/2017 | Schmitt | G01R 33/091 |

FOREIGN PATENT DOCUMENTS

| | | |
|---|---|---|
| EP | 2 546 611 A1 | 1/2013 |
| JP | 2006266999 A | 10/2006 |
| JP | 2011069635 A | 4/2011 |
| JP | 2012137457 A | 7/2012 |
| WO | 2008029520 A1 | 3/2008 |

OTHER PUBLICATIONS

Extended European Search Report for EP Patent Appln. No. 14173800.5 (Jan. 8, 2015).

* cited by examiner

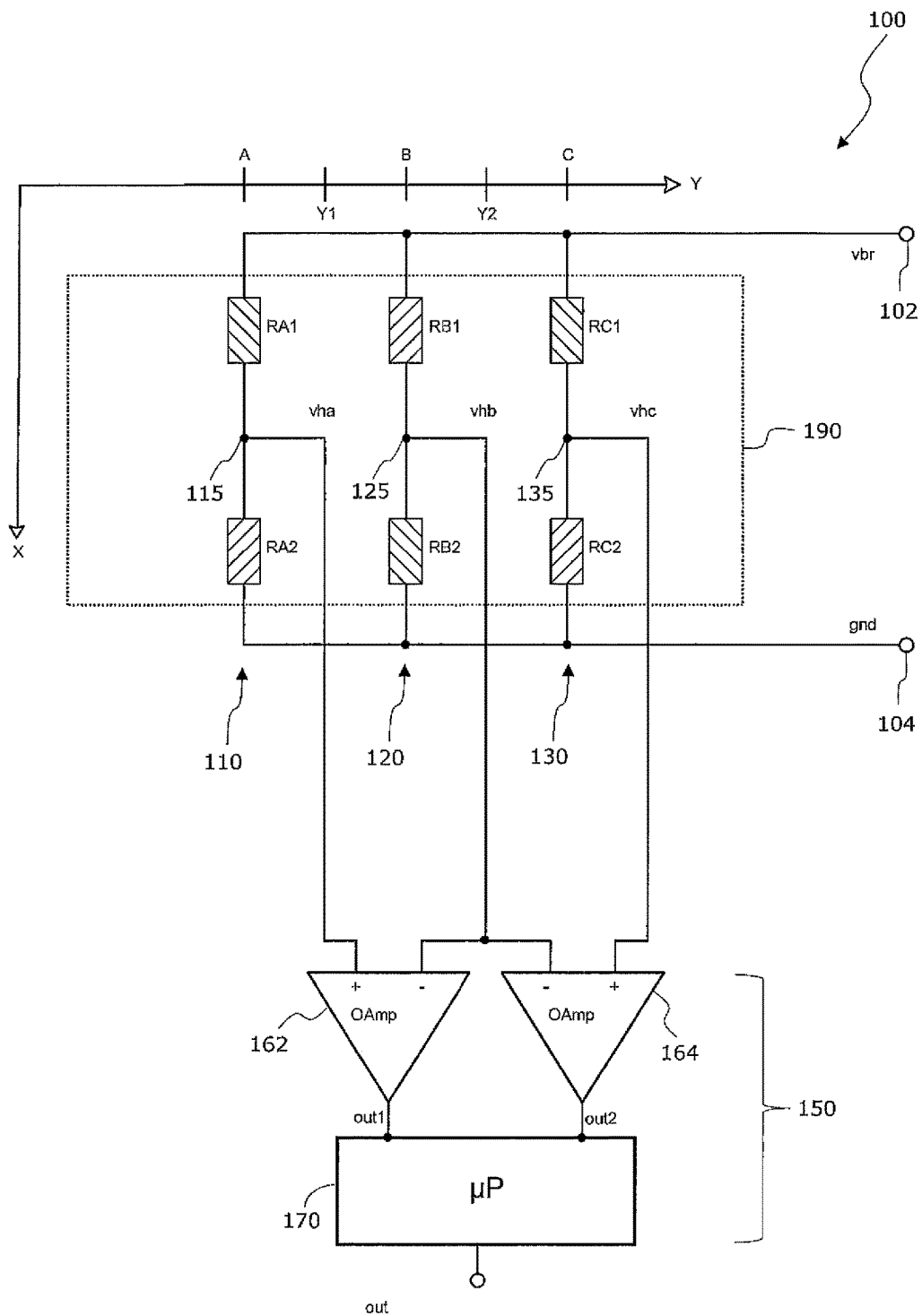

SENSOR SYSTEM WITH A THREE HALF-BRIDGE CONFIGURATION

CROSS-REFERENCE TO RELATED APPLICATIONS

This application claims the priority under 35 U.S.C. § 119 of European patent application no. 14173800.5, filed on Jun. 25, 2014, the contents of which are incorporated by reference herein.

FIELD OF THE INVENTION

The present invention relates to a sensor system having resistive sensing elements, wherein respectively two resistive sensing elements are connected in series in a sensor path of a bridge configuration. Specifically, the present invention relates to a sensor system and a method for sensing a physical quantity, in particular a magnetic field and a time dependency of a magnetic field.

BACKGROUND OF THE INVENTION

Magnetic sensor systems are increasingly important in various industries. For instance in the automotive industry various sensor systems such as parking sensors, angular sensors e.g. in throttle valves, ABS (Automatic Braking System) sensors and tire pressure sensors can be found in modern vehicles for improving comfort and safety. Magnetic sensor systems are particularly important in automotive applications, because magnetic fields penetrate easily through most materials. Magnetic sensors are also highly insensitive to dirt, unlike for example optical sensors.

Several different magnetic sensor technologies are currently available, such as magneto transistors (MT), sensors based on the Hall Effect and sensors based on the magnetoresistive effect such as anisotropic magnetoresistive (AMR) and giant magnetoresistive (GMR) sensors. The sensing principle of AMR sensor systems is based on the physical phenomenon that the electric resistance of a ferromagnetic material depends on the angle between the magnetization and the direction of the electric current within an AMR sensing element. Hall sensors and MTs, which rely on the Lorenz force, have a comparatively low sensitivity and consequently also a low accuracy.

Known ABS applications are using AMR sensor systems in order to detect a magnetic field change of an encoder wheel being mechanically connected to a vehicle wheel or vehicle tire. A typical AMR sensor system comprises a Wheatstone full-bridge configuration built with magnetoresistive sensing elements (e.g. NiFe resistor stripes). In response to detected magnetic field changes caused by a rotation of the encoder wheel a speed-pulse information can be generated. Additionally, the recognition of the rotation direction of the encoder wheel may be possible by using the spatial difference of the two half-bridges of the Wheatstone full-bridge configuration. It is mentioned that encoder wheels can be realized as a magnetically passive or a magnetically active structure. A magnetically active encoder wheel comprises at least some portions with a permanent magnet. A magnetically passive encoder wheel, which is always used in connection with a biasing magnet, disturbs and/or changes the magnetic field which is generated by the biasing magnet and which is detected by the AMR sensor system. A rotating active or passive encoder wheel periodically changes the detected magnetic field.

Some known AMR sensor systems additionally have a reference bridge, which comprises resistive reference elements, which are not sensitive to an external magnetic field. However, such AMR sensor systems suffer from output signals which have only low amplitudes and which are typically very noisy.

More sophisticated AMR sensor systems comprise two Wheatstone full-bridge configurations each being built up with at least four AMR sensing elements. However, such AMR sensor systems are suffering from an additional effort in size, current consumption and costs.

OBJECT AND SUMMARY OF THE INVENTION

There may be a need for providing a sensor system and a method for sensing a physical quantity, which on the one hand produce are reliable and low-noise signal output and on the other hand require low costs for production and/or operation.

This need may be met by the subject matter according to the independent claims. Advantageous embodiments of the present invention are described by the dependent claims.

According to a first aspect of the invention there is provided a sensor system for sensing a physical quantity. The sensor system comprises (a) a first sensor path comprising a first first sensing element and a second first sensing element being connected in series between a first supply terminal and a second supply terminal and a first intermediate node being provided in between the first first sensing element and the second first sensing element; (b) a second sensor path comprising a first second sensing element and a second second sensing element being connected in series between the first supply terminal and the second supply terminal and a second intermediate node being provided in between the first second sensing element and the second second sensing element; (c) a third sensor path comprising a first third sensing element and a second third sensing element being connected in series between the first supply terminal and the second supply terminal and a third intermediate node being provided in between the first third sensing element and the second third sensing element; and (d) a signal processing device, which is connected with the first intermediate node, the second intermediate node and the third intermediate node and which is configured for processing, based on (d1) a first electric variable being given at the first intermediate node, (d2) a second electric variable being given at the second intermediate node, and (d3) a third electric variable being given at the third intermediate node, an output signal being indicative for the sensed physical quantity.

The described sensor system is based on the idea that a sensor system comprising three half-bridges, wherein respectively one half bridge is realized by means of one of the three sensor paths, may provide some redundant measurement signals respectively information to the signal processing device, which can be used for a reliable sensing of the physical quantity, while at the same time the apparatus effort for the described sensor system is still comparatively small. Therefore, by contrast to a sensor system comprising two separate full-bridge sensor configurations, which of course also would allow for a precise and redundant measurement of the physical quantity, the effort and the costs for realizing the described sensor system is much smaller.

The redundant measurement signals, upon a suitable signal processing, can be used to obtain a plurality of pieces of information with regard to the sensed physical quantity and/or with regard to the operational state of the described sensor system. The following non-exclusive list presents some cases, which normally with prior art sensor systems would lead to wrong measurement results:

(A) In case of a so-called signal flipping a fault detection can be realized. Further, it may be possible to reduce the number faults, which affect the measurement quality of the described sensor system.

(B) In case of unwanted vibrations also a fault detection can be realized. In many cases the negative effects of such vibrations can be suppressed or at least reduced significantly.

(C) A fault detection can also be carried out with respect to a short circuit and/or an open circuit within the circuitry of the sensor system. Further, unwanted drifts in particular because of a lifetime fading of the sensor system can be detected. As a consequence, lifetime failures can be precluded and, if possible, a new calibration of the sensor system can be triggered.

The described fault detection can be realized in particular by comparing two output signals with each other. Thereby, one output signal may be associated with the first electric variable and the second electric variable and the second output signal may be associated with the second electric variable and the third electric variable.

The described electric variables being used as the three input signals for the signal processing device may be in particular voltage levels. The output signal may be any type of signal. Apart from a voltage or a current signal even an optical signal may be possible.

According to an embodiment of the invention the sensor system further comprises a probe device, which coupleable to a moving component, the movement of which is supposed to be measured. The probe device (i) is spatially located with respect to the three sensor paths and (ii) is configured in such a manner that a movement of the probe device causes a variation in time of the three electric variables.

The probe device may be of any physical structure, which upon movement causes a variation of the physical quantity to be sensed by the described sensor system. The physical properties of the probe device depend on the type of sensing elements. This means that each sensing element must be configured in order to detect the physical quantity respectively a change of the physical quantity which is provided by (a movement of) the probe device.

The probe device may be for instance a structure, which has a spatial variation of optical properties. In this context an optical parameter may be for instance the degree of reflectivity and/or the colour of a certain portion of the probe device. As a consequence, the sensing elements must be configured for detecting (a change of) these optically properties. A person skilled in the art will know a plurality of types of sensing elements which are capable of detecting optically quantities. Thereby, it might be necessary to use an appropriate light source which may illuminate the respective portions of the probe device.

The probe device may have at least partially a linear extension. This means that in a preferred application of the described sensor system upon a movement of the moving component, to which the probe device has been mechanically connected in a direct or in an indirect manner, linear movements or changes in the spatial position of the moving component can be sensed.

Due to the above described redundancy of the three electric variables, wherein each one represents one sensing signal, missing speed pulses may be detected and/or predicted by the signal processing device by means of an appropriate (redundant) signal processing. As a consequence, missing speed pulses may be virtually added. Further, also the appearance of too many speed pulses may be detected and the signal processing can be configured to suppress additional speed pulses.

According to a further embodiment of the invention the probe device is an encoder wheel which is coupleable to a rotating component, the rotation of which is supposed to be measured.

The encoder wheel may be connectable to the rotating component in a direct or in an indirect manner and rotational movements or changes in the rotational position of the rotating component can be sensed. This may allow for using the described sensor system in a plurality of applications such as e.g. for ABS (Automatic Braking System) applications. A further possible application for the described system, also in the automotive field, is the detection of the rotational position and/or the rotational speed of a crank shaft in a combustion engine.

It is mentioned, that these two (automotive) applications are also not exclusive and the described system can be used principally for measuring the rotational movement of any rotating component as long as there is enough space available for placing the sensor configuration in the vicinity of the encoder wheel, wherein the sensor configuration comprises or consists of the three sensor paths and the sensing elements being associated thereto.

According to a further embodiment of the invention with respect to a predefined axis (a) the first sensor path is located at a first position, (b) the second sensor path is located at a second position, and (c) the third sensor path is located at a third position. This means that within a (cartesian) coordinate system being defined by the predefined axis and a further (perpendicular) axis all sensing elements being assigned to one and the same sensor path have the same coordinate value with respect to this predefined axis.

In case of a probe device having at least partially a linear extension and being mechanically coupled to the component moving along the moving direction this moving direction corresponds to the direction of the predefined axis. In case of a probe device being a rotatable encoder wheel the predefined axis may correspond to a tangent of the encoder wheel. This means that the rotational axis of the encoder wheel is oriented perpendicular to this predefined axis.

It is mentioned that due to the distance along the predefined axis between the first position, the second position, and the third position, the time dependencies of the three electric variables exhibit respectively a phase difference with respect to each other. Depending on the specific application of the described sensor system this phase difference can be used for obtaining important measurement information.

According to a further embodiment of the invention at least one of the sensing elements is a magnetic sensing element. This means that the described three half-bridge sensor system is a magnetic sensor system.

Preferably, the magnetic sensing element is a magnetoresistive sensing element. This may allow for obtaining magnetic field measurements in a highly precise manner. In particular, the at least one magnetoresistive sensing element may be an AMR sensing element the operation of which relies on the known anisotropic magnetoresistance (AMR) effect. It is mentioned that also other sensing elements may be used which rely e.g. on the known effect of giant magnetoresistance (GMR), colossal magnetoresistance (CMR) and/or tunnel magnetoresistance (TMR).

In case of measuring the rotational movement of a rotating component by means of the above described encoder wheel the encoder wheel may comprise in particular a plurality of magnetic elements or a spatially varying magnetization. With a rotation of the encoder wheel this results in that within a sensing region of the altogether six sensing elements the sensed magnetic field varies in particular with respect to its amplitude.

As has already been mentioned above in the introductory portion of this document a varying magnetic field can also be obtained by means of a magnetically passive encoder wheel, which is always used in connection with a biasing magnet. In this case, the magnetic field, which is generated by the biasing magnet and which is detected by the AMR sensor system, is disturbed and/or changed by the passive encoder wheel.

According to a further embodiment of the invention each one of the six sensing elements is a magnetic sensing element. This may provide the advantage that the sensor system can be arranged in a symmetric manner. The three half-bridge paths of sensing elements can be taken from two combined full-bridge configurations. In other words, the three half-bridges can be built out of two full-bridges which have one common half-bridge.

According to a further embodiment of the invention the sensing elements are formed on a single substrate and in particular on a single semiconductor die. This embodiment of the invention can be realized in a spatially compact manner. This may be in particular of advantage when the described sensor system is formed integrally on a semiconductor substrate.

According to a further embodiment of the invention in addition to the sensing elements also at least a part of the signal processing device is formed on the single substrate.

Forming also the signal processing device on the single substrate may allow for realizing the described sensor system in a spatially very compact manner, because the sensor elements and a circuitry, which is used for providing an appropriate output signal of the described sensor system, can be implemented within a so called smart sensor. This may allow for using the described sensor system for a plurality of applications.

According to a further embodiment of the invention the signal processing device comprises (a) a first electronic unit, which is connected to the first intermediate node and to the second intermediate node and which is configured for providing a first output signal in response to the first electric variable and to the second electric variable; (b) a second electronic unit, which is connected to the second intermediate node and to the third intermediate node and which is configured for providing a second output signal in response to the second electric variable and to the third electric variable, and (c) a data processing unit, which is connected to the first electronic unit and the second electronic unit and which is configured for determining, based on the first output signal and on the second output signal, a sensor output signal being indicative of the sensed physical quantity.

The described configuration of the signal processing device may allow for an easy and reliable processing of the three electric variables and for the highly precise and correct output signal being indicative for the sensed physical quantity.

The first electronic unit and/or the second electronic unit may comprise or may consist of an operational amplifier, which determines the difference between the respective electric variables. Specifically, the first output signal being provided by the first electronic unit may be the difference between the first electric variable and the second electric variable. Accordingly, the second output signal being provided by the second electronic unit may be the difference between the second electric variable and the third electric variable.

As has already been mentioned briefly above, when a movement (e.g. a rotation) of the moving component (e.g. an encoder wheel) is measured by the described sensor system, the first output signal and the second output signal, which typically comprise both a certain periodicity, exhibit a phase difference with respect to each other. As will be described in more detail below, this phase difference can be used for obtaining valuable measurement information.

According to a further embodiment of the invention the data processing unit is configured for calculating a sum of the first output signal and the second output signal.

Calculating the sum of both output signals may result in a doubling of the signal amplitude. Further, a distortion may be reduced and the Signal to Noise ratio may be increased. This all may contribute to an overall improved operation of the described sensor system.

With respect to the spatial positions of the sensor paths along the predefined axis it is pointed out that the sum of the two output signals is related to the middle point of the sensor configuration, which comprises or consists of the three half-bridge sensor paths.

According to a further embodiment of the invention the data processing unit is configured for calculating a difference between the first output signal and the second output signal.

Also the (amplitude) difference between the two output signals will be related to the spatially middle position of the sensor configuration with the three half-bridge sensing paths.

Calculating both the sum and the difference of both output signals may result in two phase shifted signals which can be used for obtaining a reliable speed information about the sensed movement/rotation and/or for recognizing the direction of the movement respectively the rotation.

According to a further embodiment of the invention the data processing unit is configured for calculating a phase difference between a first periodic waveform of the first output signal and a second periodic waveform of the second output signal.

In case of a movement (e.g. rotation) of the component being supposed to be sensed each one of the two output signals represents a speed signal. Calculating the phase difference between these two speed/output signals may provide the advantage that a reliable signal prediction can be carried out. This may allow for performing a fault detection e.g. by comparing both speed signals against each other and/or against their prediction. The ability for performing a fault detection and possibly also for performing a fault correction (by means of an appropriate algorithm) may be based in particular on the matter of fact that in a preferred embodiment of the invention the two output signals are at least approximately equal in height and only deviate from each other with respect to their phase. As has already been mentioned above this phase difference can be caused in particular by the above described spatial distance of the three half-bridge sensor paths It is mentioned that in particular when the data processing unit is capable of performing at least one and preferably two or all three above-mentioned types of calculations a plurality of qualifications of the signal validity can be performed and can be used for validating the two output signals. Further, the location (in time) of minima and/or maxima, of zero crossings can be determined. Furthermore, signal slopes, static offsets and offset jumps of at least one speed signal can be recognized and can be used for processing the two output signals and/or for determining the sensor output signal.

According to a further embodiment of the invention there is provided a method for sensing a physical quantity, in particular by means of a sensor system as described above. The provided method comprises determining an output signal being indicative for the sensed physical quantity based on (a) a first electric variable being given at a first intermediate node, (b) a second electric variable being given at a second intermediate node, and (c) a third electric variable being given at a third intermediate node. The first intermediate node is assigned to a first sensor path and is located in between a first first sensing element and a second first sensing element. The second intermediate node is assigned to a second sensor path and is located in between a first second sensing element and a second second sensing element. The third intermediate node is assigned to a third sensor path and is located in between a first third sensing element and a second third sensing element.

Also the described method is based on the idea that by employing the sensor system which comprises three half-bridge sensor paths signal redundancy can be obtained when all electric variables being present at the three intermediate nodes are used for determining the output signal of the whole sensor system, which output signal reflects the measured physical quantity.

It is mentioned that the described sensor system when comprising exactly three half-bridge sensor paths seems to be present very attractive technical compromise between (a) a very simple sensor system, which comprises only one full-bridge sensor configuration and which does not provide a redundancy of measurement signals and (b) a much more sophisticated sensor system, which comprises at least two separated full-bridge sensor configurations.

According to a further embodiment of the invention determining the output signal comprises a redundant processing of the first electric variable, the second electric variable, and the third electric variable. The described method further comprises performing a fault detection for the output signal based on the redundancy of the first electric variable, the second electric variable, and the third electric variable in particular by counting, comparing and/or qualifying a zero-crossing of each one of the electric variables. For counting, comparing and/or qualifying the zero-crossing the respective electric variables may be before subjected to a noise reduction procedure.

As has already been mentioned above, with the fault detection different types of faults can be detected and, if applicable, corrected. From a practical point relevant types of faults which could be detected are (A) a so-called signal flipping, (B) faults caused by unwanted vibrations, (C) a short circuit and/or an open circuit within the circuitry of the sensor system, and (D) unwanted drifts in particular because of a lifetime fading of the sensor system. Further, in case of a translational or rotational movement measurement (E) missing speed pulses, and/or (F) additional spurious speed pulses may be detected by means of an appropriate fault detection algorithm carried out by the signal processing device.

According to a further embodiment of the invention the first sensor path defines a first sensing position, the second sensor path defines a second sensing position, and the third sensor path defines a third sensing position, wherein the second sensing position is located in between the first sensing position and the third sensing position. The method further comprises (a) measuring a variation in time of the three electric variables, which variation in time is caused by a probe device being coupled to a moving component, the movement of which is supposed to be measured, wherein the probe device (i) is spatially located with respect to the three sensing positions and (ii) is configured in such a manner that a movement of the probe device causes the variation in time, (b) processing a first output signal representing the difference between the first electric variable and the second electric variable, (c) processing a second output signal representing the difference between the third electric variable and the second electric variable, (d) calculating (i) a sum of the first output signal and the second output signal and (ii) a difference between the first output signal and the second output signal, and (e) detecting a direction of the movement of the moving component with respect to the second sensing position (B) in response to the calculated sum and the calculated difference.

The probe device may be in particular an encoder wheel which is coupled to a rotating component, the rotation of which is supposed to be measured. As has already been mentioned above the probe device may have any physical structure, which upon movement causes a variation of the physical quantity to be sensed by the described method.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

The aspects defined above and further aspects of the present invention are apparent from the example of embodiment to be described hereinafter and are explained with reference to this example of embodiment. The invention will be described in more detail hereinafter with reference to the example of embodiment but to which the invention is not limited.

BRIEF DESCRIPTION OF THE DRAWINGS

The FIGURE shows a magnetic field sensor system with three half-bridge sensor paths each comprising two AMR magnetic sensor elements.

DESCRIPTION OF EMBODIMENTS

The illustration in the drawing is schematically. It is noted that spatially relative terms, such as "front" and "back", "above" and "below", "left" and "right", et cetera are used to describe an element's relationship to another element(s) as illustrated in the FIGURES. Thus, the spatially relative terms may apply to orientations in use which differ from the orientation depicted in the FIGURE. Obviously, though, all such spatially relative terms refer to the orientation shown in the FIGURE for ease of description and are not necessarily limiting as a system according to an embodiment of the invention can assume orientations different than those illustrated in the FIGURE when in use.

FIG. 1 shows in accordance with a presently preferred embodiment of the invention a magnetic sensor system 100 which comprises a sensing configuration. This sensing configuration consists of three sensing paths 110, 120 and 130.

As can be seen from the FIGURE, each sensing path comprises (i) two sensing elements being connected in series with respect to each other and (ii) an intermediate node in between the respective two sensing elements. As can be further seen from the FIGURE, the three sensing paths 110, 120, and 130 are connected in parallel with respect to each other in between the first supply terminal 102 and the second supply terminal 104. According to the embodiment described here the first supply terminal 102 carries a positive supply voltage vbr and the second supply terminal 104 is defined by electric ground gnd.

Specifically, the first sensor path 110 comprises a first first sensing element RA1, a first intermediate node 115, and second first sensing element RA2. The second sensor path 120 comprises a first second sensing element RB1, a second intermediate node 125, and second second sensing element RB2. Accordingly, the third sensor path 130 comprises a first third sensing element RC1, a third intermediate node 135, and second third sensing element RC2.

In the embodiments described here all sensing elements are AMR sensing elements which may be made in particular of NiFe resistor stripes. Preferably, all sensing elements are formed by means of a semiconductor processing technology directly on a non-depicted wafer.

It is mentioned that it is not necessary to realize all sensing elements RA1, RA2, RB1, RB2, RC1, and RC2 as AMR sensing elements. It may be possible, for instance, that the middle half-bridge is a bridge comprising a plurality of resistor elements which may not be magnetoresistive.

It is further mentioned that the orientations of the NiFe stripes respectively the orientations of the barber pole structures depicted within the sensing elements RA1, RA2, RB1, RB2, RC1, and RC2 may be different.

The magnetic sensor system 100 is used for determining the rotational position and/or the rotational speed of an encoder wheel 190, which in the FIGURE is illustrated by means of a dashed line. This encoder wheel 190 is mechanically coupled to a rotating component, the rotation of which is supposed to be measured. In accordance with known designs of a magnetic sensor system having a magnetic encoder wheel the encoder wheel 190 rotates around a rotational axis. This rotational axis is oriented parallel to the X axis shown in the FIGURE and intersects with the Y axis shown in the FIGURE at a second position B.

The encoder wheel 190 may be a so-called active encoder wheel 190 which comprises several magnetic elements or magnetic portions such that upon a rotation of the encoder wheel 190 (the strength of) a magnetic field in a sensing region of the magnetic sensor system 100 shows a pronounced time dependency. This time dependency is sensed by the magnetic sensor system 100 and in response to this sensed time dependency the rotational position and/or the rotational speed of the rotating component is determined. As has already been mentioned above, the encoder wheel 190 may alternatively be a so-called passive encoder wheel, which comprises a plurality of teeth which are made from a material that perturbs a magnetic field originating from a non-depicted biasing magnet. For determining the rotational position and/or the rotational speed of the rotating component the time dependency of this perturbation is evaluated.

As can be seen from the FIGURE, the sensor system 100 further comprises a signal processing device 150 which receives three input signals. These three input signals are given by a first electric variable vha being present at the first intermediate node 115, a second electric variable vhb being present at the second intermediate node 125, and a third electric variable vhc being present at the third intermediate node 135.

Specifically, according to the embodiment described here a first electronic circuit 162 of the signal processing device 150 receives the first electric variable vha and the second electric variable vhb and provides a first (differential) output signal out1 which is given by the difference between the first electric variable vha and the second electric variable vhb. This first electronic circuit 162 is realized by means of a simple operational amplifier and/or an analog-digital converter. Accordingly, a second electronic circuit 164 of the signal processing device 150 receives the second electric variable vhb and the third electric variable vhc and provides a second (differential) output signal out2 which is given by the difference between the second electric variable vhb and the third electric variable vhc. Also the second electronic circuit 164 is realized by means of a simple operational amplifier and/or an analog-digital converter.

The two (differential) output signals out1 and out2 are fed into the data processing unit 170, which generates an sensor output signal out in response to the first (differential) output signal out1 and the second (differential) output signal out2. According to the embodiment described here the data processing unit 170 is a micro-processor, which is capable of performing a plurality of different processing algorithms with the two (differential) output signals out1 and out2. A suitable processing algorithms may be for instance an analog-digital conversion.

In the following the basic principle of the described sensor system 100 which comprises the three half-bridge sensor paths 110, 120, 130 each having two AMR sensing elements will be described in a descriptive way:

As can be seen from the FIGURE, with respect to the Y direction the three half-bridge sensor paths 110, 120, 130 are located at three different positions. Specifically, the first sensor path 110 is located at a first position A, the second sensor path 120 is located at a second position B, and the third sensor path 130 is located at a third position C. From the intermediate nodes 115, 125, 135 each being assigned to one of the sensor paths 110, 120, 130, two (differential) speed signals being represented by the two output signals out1 and out2 are generated by the two operational amplifiers 162 and 164. The two (differential) speed signals out1 and out2 are generated in the following way:

$$\text{out1} = vha - vhb \quad (1)$$

$$\text{out2} = vhc - vhb \quad (2)$$

As can be taken from the FIGURE, the two (differential) speed signals out1 and out2 are spatially related to virtual reading points Y1 and Y2, respectively.

Using the three input signals vha, vhb, and vhc for generating the two (differential) speed signals out1 and out2 means that a redundancy is given with respect to the differential signal processing from the three half-bridges. This redundancy can be exploited in a beneficial manner in order to achieve an increased or a maximum signal amplitude, a high signal to noise ratio and/or an excellent rejection of noise ripples being present on the positive supply voltage vbr.

For instance, a speed information and directional recognition of the rotating encoder wheel can be generated by evaluating the sum and the difference of both differential speed signals:

$$\text{Sum} = \text{out1} + \text{out2} = vha + vhc - 2 \cdot vhb \quad (3)$$

$$\text{Diff}=\text{out1}-\text{out2}=vha-vhc \qquad (4)$$

Both processed signals Sum and Diff are related to the second virtual reading point B given in the FIGURE.

A fault detection over the lifetime of the sensor system 100 may be realized by comparing both (differential) output signals out1 and out2 in order to detect "openings" or "shortcuts" within the various signal paths.

Further, comparing peak-peak amplitudes and static offsets related to a defined hysteresis level may indicate a parameter drift over lifetime. Herewith, each (differential) speed signal out1 and out2 plus the sum and difference of both speed signals can be analysed. The results may be used in a subsequent signal processing by means of the data processing unit 170 in order to indicate device failures, e.g. missing pulses, too many pulses or a false direction recognition caused by wrong signal zero crossings.

The circuitry of the described magnetic sensor system 100 is able to detect magnetic field changes on rotating encoder wheels and generates an electrical speed signal depending on the rotation frequency and the rotation direction. Passive or active encoder wheels may be used for applications within ABS systems or transmission gears. However, the described sensor system may also be used for applications other than automotive applications. For instance the magnetic sensor system can be used for applications wherein a magnetically active or a magnetically sensitive linear probe is used for distance measurements or linear accelerators. The magnetic sensor system may also be used for instance as a counter for magnetic or magnetisable elements (axle counter). Even further, all other physical effects, which can be measured with a Wheatstone-bridge structure, are possible applications for a sensor system in accordance with another embodiment of the invention, which sensor system has the spatial configuration of the described magnetic sensor system 100.

The invention or embodiments of the invention described in this document can be descriptively summarized as follows: The described sensor system 100 is a wheel-speed sensor with three half-bridges wherefrom two (differential) speed signals out1, out2 are generated. The speed signals out1, out2 are related to the spatial difference of the two outer half-bridges with respect to the center half-bridge. The sum and difference of these speed signals out1, out2 can be used to generate speed and direction information. Because both speed signals out1, out2 are equal and only deviate in phase due to the spatial distance of the three half-bridges, a fault detection and failure reduction algorithm can be applied. Therefore, the described sensor system 100 can be used for all systems which are using fault detection and reduction methods for an improved functional safety according ISO 26262.

It is mentioned that the circuitry of the described sensor system 100 can also be used for all kind of sensors which are using a Wheatstone-bridge structure for detecting a change in time of a physical quantity by means of sensor elements being located at spatially different positions.

REFERENCE NUMERALS 100 sensor system
102 first supply terminal
104 second supply terminal
110 first sensor path
115 first intermediate node
120 second sensor path
125 second intermediate node
130 third sensor path
135 third intermediate node
150 signal processing device
162 first electronic circuit/operational amplifier
164 first electronic circuit/operational amplifier
170 data processing unit
190 probe device/(magnetic) encoder wheel
RA1 first first sensing element (AMR element)
RA2 second first sensing element (AMR element)
RB1 first second sensing element (AMR element)
RB2 second second sensing element (AMR element)
RC1 first third sensing element (AMR element)
RC2 second third sensing element (AMR element)
vbr positive supply voltage
gnd ground voltage
vha first electric variable/first input signal
vhb second electric variable/second input signal
vhb third electric variable/third input signal
out1 first output signal/first (differential) speed signal
out2 second output signal/second (differential) speed signal
out sensor output signal
A first position/first virtual reading point
B second position/second virtual reading point
C third position/third virtual reading point
Y1/Y2 virtual reading point

The invention claimed is:

1. A sensor system for sensing a physical quantity, the sensor system comprising a first sensor path comprising a first first sensing element and a second first sensing element being connected in series between a first supply terminal and a second supply terminal and a first intermediate node being provided in between the first first sensing element and the second first sensing element; a second sensor path comprising a first second sensing element and a second second sensing element being connected in series between the first supply terminal and the second supply terminal and a second intermediate node being provided in between the first second sensing element and the second second sensing element; a third sensor path comprising a first third sensing element and a second third sensing element being connected in series between the first supply terminal and the second supply terminal and a third intermediate node being provided in between the first third sensing element and the second third sensing element; and a signal processing device connected to the first intermediate node, the second intermediate node and the third intermediate node and which is configured for processing, based on a first electric variable being given at the first intermediate node, a second electric variable being given at the second intermediate node, and a third electric variable being given at the third intermediate node, an output signal being indicative for the sensed physical quantity, wherein the signal processing device produces a first differential output using the first electric variable and the second electric variable, and a second differential output using the third electric variable and the second electric variable, wherein the first and second differential outputs are used to produce the output signal.

2. The sensor system as set forth in claim 1, further comprising a probe device, which coupleable to a moving component, the movement of which is supposed to be measured, wherein the probe device is spatially located with respect to the three sensor paths and (ii) is configured in such a manner that a movement of the probe device causes a variation in time of the three electric variables.

3. The sensor system as set forth in claim 1, wherein the probe device in an encoder wheel which is coupleable to a rotating component, the rotation of which is supposed to be measured.

4. The sensor system as set forth in claim 1, wherein with respect to a predefined axis the first sensor path is located at a first position, the second sensor path is located at a second position, and the third sensor path is located at a third position.

5. The sensor system as set forth in claim 1, wherein at least one of the sensing elements is a magnetic sensing element.

6. The sensor system as set forth in claim 1, wherein each one of the six sensing elements is a magnetic sensing element.

7. The sensor system as set forth claim 1, wherein the sensing elements (RA1, RA2, RB1, RB2, RC, RC2) are formed on a single substrate and in particular on a single semiconductor die.

8. The sensor system as set forth in claim 1, wherein in addition to the sensing elements also the signal processing device is formed on the single substrate.

9. The sensor system as set forth in claim 1, wherein the signal processing device comprises a first electronic unit, which is connected to the first intermediate node and to the second intermediate node and which is configured for providing a first differential output signal in response to the first electric variable and to the second electric variable, a second electronic unit, which is connected to the second intermediate node and to the third intermediate node and which is configured for providing a second differential output signal in response to the second electric variable and to the third electric variable, and a data processing unit, which is connected to the first electronic unit and the second electronic unit and which is configured for determining, based on the first differential output signal and on the second differential output signal, a sensor output signal being indicative of the sensed physical quantity.

10. The sensor system as set forth in claim 9, wherein the data processing unit is configured for calculating a sum of the first differential output signal and the second differential output signal.

11. The sensor system as set forth claim 9, wherein the data processing unit is configured for calculating a difference between the first differential output signal and the second differential output signal.

12. The sensor system as set forth in claim 9, wherein the data processing unit is configured for calculating a phase difference between a first periodic waveform of the first differential output signal and a second periodic waveform of the second differential output signal.

13. A method For sensing a physical quantity, in particular by means of a sensor system as set forth in claim 1, the method comprising determining an output signal being indicative for the sensed physical quantity based on a first electric variable being given at a first intermediate node, a second electric variable being given at a second intermediate node, and a third electric variable being given at a third intermediate node, wherein the first intermediate node is assigned to a first sensor path and is located in between a first first sensing element and a second first sensing element, wherein the second intermediate node is assigned to a second sensor path and is located in between a first second sensing element and a second second sensing element, and wherein the third intermediate node is assigned to a third sensor path and is located in between a first third sensing element and a second third sensing element.

14. The method as set forth in claim 1, wherein the determining the output signal comprises a redundant processing of the first electric variable, the second electric variable, and the third electric variable, wherein the method further comprises performing a fault detection for the output signal based on the redundancy of the first electric variable, the second electric variable, and the third electric variable in particular by counting, comparing and or qualifying a zero-crossing of each one of the electric variables.

15. The method as set forth in claim 13, wherein the first sensor path defines a first sensing position, the second sensor path defines a second sensing position, and the third sensor path defines a third sensing position, wherein the second sensing position is located in between the first sensing position and the third sensing position, wherein the method further comprises measuring a variation in time of the three electric variables, which variation in time is caused by a probe device being coupled to a moving component, the movement of which is supposed to be measured, wherein the probe device is spatially located with respect to the three sensing positions and is configured in such a manner that a movement of the probe device causes the variation in time, processing a first differential output signal representing the difference between the first electric variable and the second electric variable, processing a second differential output signal representing the difference between the third electric variable and the second electric variable, calculating a sum of the first differential output signal and the second differential output signal and a difference between the first differential output signal and the second differential output signal, and detecting a direction of the movement of the moving component with respect to the second sensing position in response to the calculated sum and the calculated difference.

* * * * *